(12) United States Patent
Rajavel et al.

(10) Patent No.: US 7,692,212 B1
(45) Date of Patent: Apr. 6, 2010

(54) TRANSISTOR WITH INGAASP COLLECTOR REGION AND INTEGRATED OPTO-ELECTRONIC DEVICES EMPLOYING SAME

(75) Inventors: Rajesh D. Rajavel, Oak Park, CA (US); Stephen Thomas, III, Redondo Beach, CA (US)

(73) Assignee: HRL Laboratories, LLC, Malibu, CA (US)

( * ) Notice: Subject to any disclaimer, the term of this patent is extended or adjusted under 35 U.S.C. 154(b) by 590 days.

(21) Appl. No.: 11/007,697

(22) Filed: Dec. 7, 2004

(51) Int. Cl.
   *H01L 27/144* (2006.01)

(52) U.S. Cl. .................. 257/184; 257/197; 257/432; 257/458; 257/E27.128

(58) Field of Classification Search .................. 257/184, 257/197–198, 458, 432, E23.128
   See application file for complete search history.

(56) References Cited

U.S. PATENT DOCUMENTS

| | | | | |
|---|---|---|---|---|
| 5,357,127 A | * | 10/1994 | Park et al. | 257/189 |
| 5,557,117 A | * | 9/1996 | Matsuoka et al. | 257/184 |
| 5,689,122 A | * | 11/1997 | Chandrasekhar | 257/184 |
| 6,885,042 B2 | * | 4/2005 | Yanagisawa et al. | 257/197 |

* cited by examiner

*Primary Examiner*—Kiesha L Rose
*Assistant Examiner*—Tsz K Chiu
(74) *Attorney, Agent, or Firm*—Ladas & Parry

(57) ABSTRACT

A double heterojunction bipolar transistor on a substrate comprises a collector formed of InGaAsP, a base in contact with the collector, an emitter in contact with the base, and electrodes forming separate electrical contacts with each of the collector, base, and emitter, respectively. A device incorporates this transistor and an opto-electronic device optically coupled with the collector of the transistor to interact with light transmitted therethrough.

11 Claims, 5 Drawing Sheets

TRANSISTOR WITH INGAASP COLLECTOR REGION AND INTEGRATED OPTO-ELECTRONIC DEVICES EMPLOYING SAME

TECHNICAL FIELD

This disclosure relates to integrated semiconductor devices, and more particularly to a new bipolar transistor structure such as a double heterojunction bipolar transistor (DHBT) and integrated opto-electronic devices employing such a transistor.

BACKGROUND

Current InP-based HBTs typically employ InP or InGaAs as the collector. InGaAlAs and InGaAs/graded-InGaAsP/InP composite collectors have also been utilized. No reported literature, however, makes reference to further using the collector material for waveguide applications. InGaAs, which is a commonly used collector material in InP-based HBTs, absorbs light with wavelengths shorter than 1.5 microns, and hence cannot practically be used as a waveguide material. InP is transparent to 1.5 micron light, but cannot be easily clad with a semiconductor to confine light to thereby serve as a waveguide.

For a DHBT to function satisfactorily, there should be no spike in the conduction band between the base and the collector. As appreciable by those skilled in the art, the compositions of the alloys forming the base and the collector that enable transistor operation are not obvious and must be experimentally derived for each particular application. Controlling the composition of thick (~2000 Å thickness used in the collector) mixed group-V alloys in order to maintain good lattice matching with the InP substrate is likewise not a straightforward matter.

What is needed is a method and apparatus for providing DHBTs with good waveguide properties to enable the manufacture of highly-integrated opto-electronic devices. The embodiments of the present disclosure answer these and other needs.

SUMMARY

In a first embodiment disclosed herein, a bipolar transistor on a substrate comprises a collector formed substantially of InGaAsP having a first conductivity type, a base having a second conductivity type in contact with the collector, an emitter of the first conductivity type in contact with the base, and electrodes forming separate electrical contacts with each of the collector, base, and emitter, respectively.

In another embodiment disclosed herein, a device comprises at least one bipolar transistor on a substrate, the transistor comprising a collector formed substantially of InGaAsP of a first conductivity type to transmit light therethrough, a base formed substantially of InGaAs or GaAsSb of a second conductivity type in contact with the collector, an emitter of the first conductivity type in contact with the base, and transistor electrodes forming separate electrical contacts with each of the collector, base, and emitter, respectively, and at least one opto-electronic device optically coupled with the collector of the transistor to interact with the light transmitted therethrough.

In a further embodiment disclosed herein, the electro-optical device may be butt coupled with the collector of the transistor or evanescently coupled with the electromagnetic field of the collector. The conduction band energy level of the base may be higher than the conduction band energy level of $In_{0.53}Ga_{0.47}As$, and the Ga mole fraction in the base may be above 0.47. A graded layer may be formed in the collector in contact with the base and varying in composition to minimize a conduction band discontinuity between the base and the collector.

These and other features and advantages will become further apparent from the detailed description and accompanying figures that follow. In the figures and description, numerals indicate the various features, like numerals referring to like features throughout both the drawings and the description.

DETAILED DESCRIPTION

Figure 1:
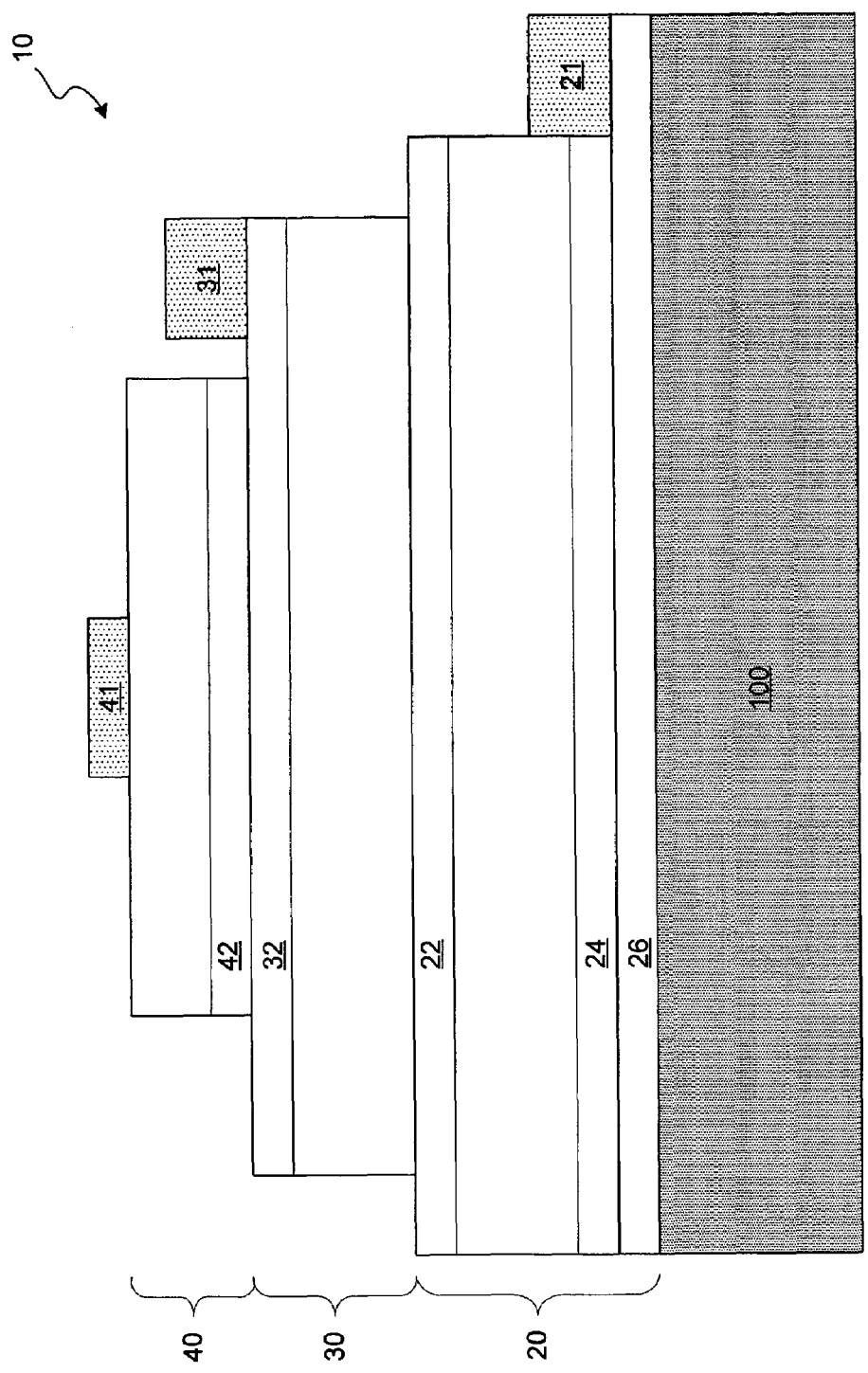
FIG. 1 is a structural diagram of a DHBT that may be formed in accordance with the present disclosure.

Referring to FIG. 1, a generic DHBT structure 10 is shown for discussion purposes. A transistor such as DHBT 10 is typically formed on a substrate 100, and includes a collector layer 20 disposed on the substrate, a base layer 30 disposed over the collector layer, and an emitter layer disposed over the base layer 40. Electrical contacts 21, 31, 41 provide electrical contact to each of the collector 20, base 30, and emitter 40 respectively. As well known to those skilled in the art, the collector and emitter are doped with a dopant of one conductivity type (e.g. n-type) and the base is doped with a dopant of the opposite conductivity type (e.g. p-type). The collector, base and emitter layers may be further formed with various sublayers, as discussed elsewhere herein.

A material for forming the base that is currently widely used is an alloy of InGaAs. A particularly favored alloy composition is $In_{0.53}Ga_{0.47}As$, because this alloy matches the lattice constant of InP, which is a favored material for the substrate 100. In accordance with a novel aspect of the present disclosure, a DHBT is described that uses a collector formed of an InGaAsP alloy that exhibits proper semiconductor characteristics as well as good waveguide characteristics.

Figure 2:
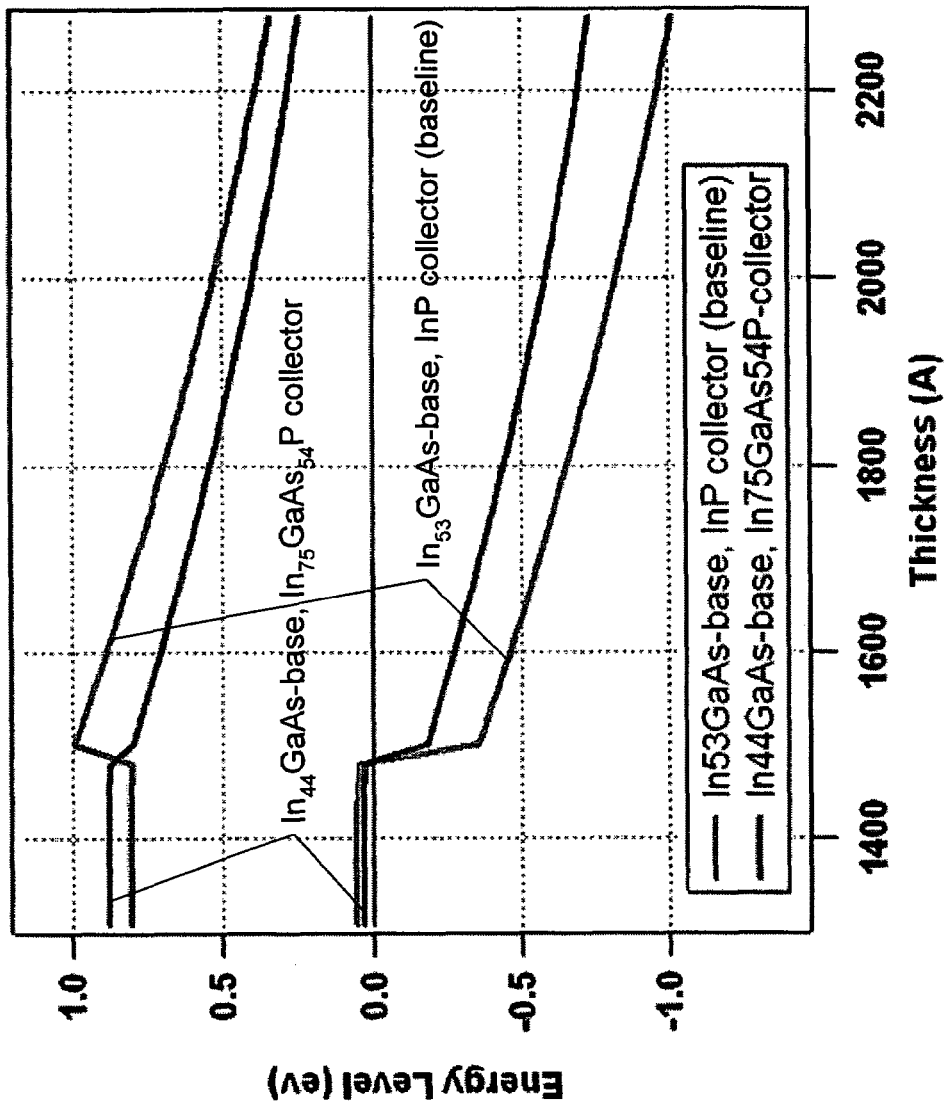
FIG. 2 is a graph depicting Poisson band bending models for the base collector interface for a baseline DHBT and a DHBT formed in accordance with the present disclosure.

Published data available in the literature were used to perform band bending simulations for the base collector junction. The simulations indicated that the conduction band offset between the $In_{0.75}Ga_{0.25}As_{0.54}P_{0.46}$ (collector) and the $In_{0.44}Ga_{0.56}As$ (strained base) is approximately −0.1 to 0.1 eV, as depicted in the graph of FIG. 2. Because a small or negative offset in the base/collector band alignment is highly desirable for the unimpeded electron transport from the base to the collector, DHBTs with an abrupt base collector junction were initially grown and fabricated. However, the DC gain for these abrupt junction transistors was less than 2, indicating the presence of a significant barrier at the base collector interface that was contrary to the theoretical estimates. Subsequent to this finding, DHBT structures were grown with a graded InGaAsP layer 22 as the transition between the base 30 and the collector 20 to eliminate the barrier in the conduction band.

Table 1 lists an approximate structure composition of this embodiment. As shown, the collector 20 consists of a $In_{0.75}Ga_{0.25}As_{0.54}P_{0.46}$ quaternary layer. $In_{0.44}Ga_{0.56}As$, coherently strained for a thickness of 350 Å, forms the base 30 of the transistor. The alloy composition of the collector can be varied while allowing lattice matching to the base and keeping the conduction band offset between the base and the collector to a minimum. For this embodiment, a 450 Å graded collector was employed to achieve a smooth grading in the conduction band energy between the base and the collector.

The material structure shown in Table 1 was grown by MBE, and transistors were fabricated. A dry-etch process was developed to etch the quaternary collector 20, as wet etching was found to produce unacceptable levels of under-cut. The DC gain measured for this embodiment was ~25, and could be further increased by optimizing the composition of the quaternary graded layer 22. The collector breakdown voltage $BV_{ceo}$ was as high as 6V for the transistor, for a collector thickness of 2000 Å. The base-emitter turn-on voltage ($V_{be}$) was measured at 0.6V and the reverse breakdown voltage was measured at 2V.

TABLE 1

| DHBT Layer Description | 2003-DHBT0.75-I-3463 | |
|---|---|---|
| | Thickness (Å) | Doping Level ($cm^{-3}$) |
| InGaAs contact | ~1000 | n:2E19 |
| InAlAs emitter contact | ~400 | n:1E19 |
| InAlAs emitter | ~1000 | n:1E18 |
| Chirped SLs | ~300 | n:1E18 |
| $In_{0.44}Ga_{0.56}As$ spacer layer | ~50 | p:2E18 |
| $In_{0.44}Ga_{0.25}As$ base layer | ~300 | p:3E18 |
| $In_{0.75}Ga_{0.25}As_{0.54}P_{0.46}$ to $In_{0.44}Ga_{0.56}As$ graded collector layer | ~450 | n:7E16 |
| $In_{0.75}Ga_{0.25}As_{0.54}P_{0.46}$ collector layer | ~1500 | n:7E16 |
| $In_{0.75}Ga_{0.25}As_{0.54}P_{0.46}$ sub collector layer | ~100 | n:2E19 |
| InGaAs sub-collector | ~3000 | n:2E19 |
| Substrate | $6 \times 10^7$ | SI |

The DHBT 10 formed as per Table 1 incorporates a coherently strained $In_{0.44}Ga_{0.56}As$ base layer 30. Due to the increase in the Ga mole fraction from 47% (lattice matched to InP) to 56%, the energy level of the conduction band is raised by ~0.1 eV (see FIG. 2), thereby lowering the barrier at the base collector interface. Raising the conduction band energy level proved to be crucial in enabling the transistor to exhibit practical gain. The critical layer thickness for the growth of $In_{0.44}Ga_{0.56}As$ on InP is ~500 Å, comparable to the thickness of the base layer in a typical transistor. Hall measurements were performed on 400 Å thick $In_{0.44}Ga_{0.56}As$:Be to compare the mobility with the lattice matched alloy that is typically used in transistors. The results for two compositions of strained InGaAs along with the properties of lattice matched reference $In_{0.53}Ga_{0.47}As$:Be are listed in Table 2. As expected, the mobility decreased with increasing Ga mole fraction. The sheet resistance of the base layer increased by about 10% as the Ga mole fraction was increased from 47% to 56%. This is a relatively minor effect, since the decrease in mobility can be compensated by doping the alloy with the higher Ga mole fraction more heavily. Thus no sheet resistance penalty is anticipated by using $In_{0.44}Ga_{0.56}As$:Be as the base layer.

TABLE 2

| Run # | Structure | Boule # | Rs (ohm/sq) | Rs (Hall) (ohm/sq) | n ($cm^{-3}$) | mu ($cm^2/V.s$) |
|---|---|---|---|---|---|---|
| I-3245 | $In_{.46}Ga_{.54}As$:Be | S615-69 | 640.5 | 630.5 | 3.18E+19 | 62.2 |
| I-3247 | $In_{.53}Ga_{.47}As$:Be | S615-76 | 581.2 | 591.4 | 3.25E+19 | 65 |
| I-3258 | $In_{.44}Ga_{.56}As$:Be | S813-13 | 668.4 | 653.5 | 3.30E+19 | 58.03 |

Figure 3:
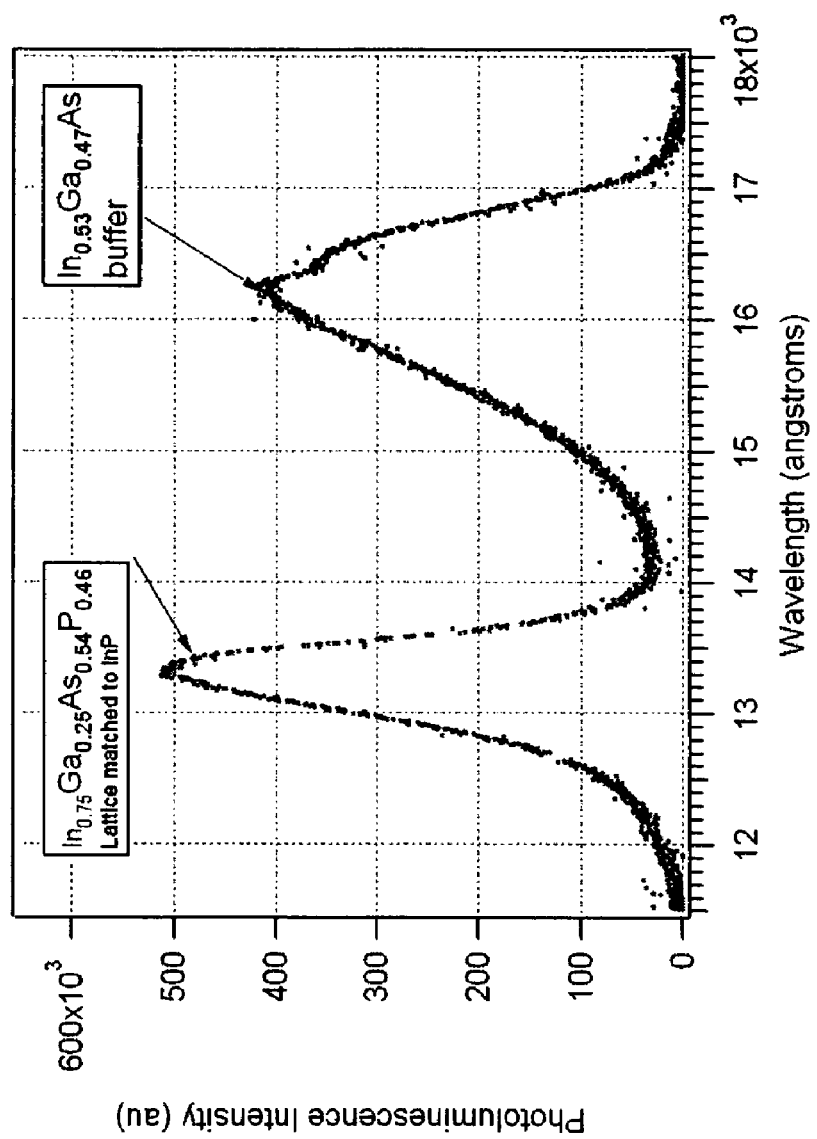
FIG. 3 is a graph depicting the room temperature photoluminescence spectrum for an MBE-grown $In_{0.75}Ga_{0.25}As_{0.54}P_{0.46}$ film deposited on InGaAs, in accordance with the present disclosure.

The composition of the quaternary layer was determined from x-ray and photoluminescence (PL) measurements. A strong PL signal was measured from InGaAsP layers grown on InGaAs buffer layers indicating the high-quality of the InGaAsP layer. FIG. 3 shows the measured room temperature PL spectrum for an MBE-grown $In_{0.75}Ga_{0.25}As_{0.54}P_{0.46}$ film deposited on InGaAs. The band-gap of this quaternary layer 20 was 0.9 eV.

Figure 4:
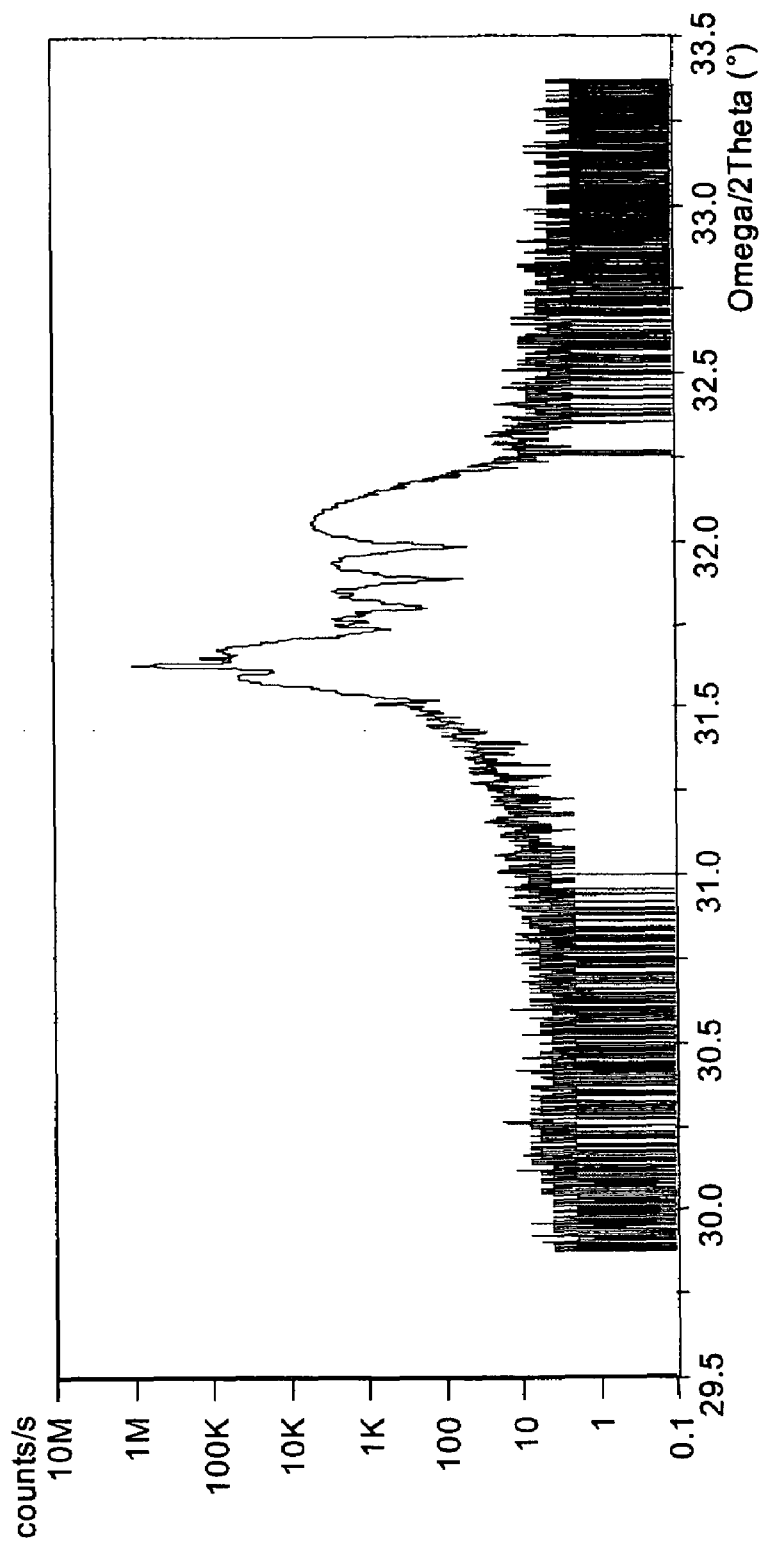
FIG. 4 is a graph depicting the x-ray rocking curve for a DHBT using a lattice matched $In_{0.75}Ga_{0.25}As_{0.54}P_{0.46}$ collector and a strained base layer, in accordance with the present disclosure.

The x-ray rocking curve for a quaternary collector 20 DHBT is shown in FIG. 4. As shown in the structure diagram listed in Table 2, this device uses a lattice matched $In_{0.75}Ga_{0.25}As_{0.54}P_{0.46}$ collector 20 and a strained base layer 30. FIG. 4 shows that the lattice constant of the collector closely matches that of the substrate. Close lattice matching was achieved due to the excellent composition control over the group-V flux achieved by using gas-source MBE. The peak at 32.06 degrees is from the strained $In_{0.53}Ga_{0.47}As$ base layer. The strong interference oscillations shown confirm abrupt interfaces and high quality of the device structure.

Figure 5:
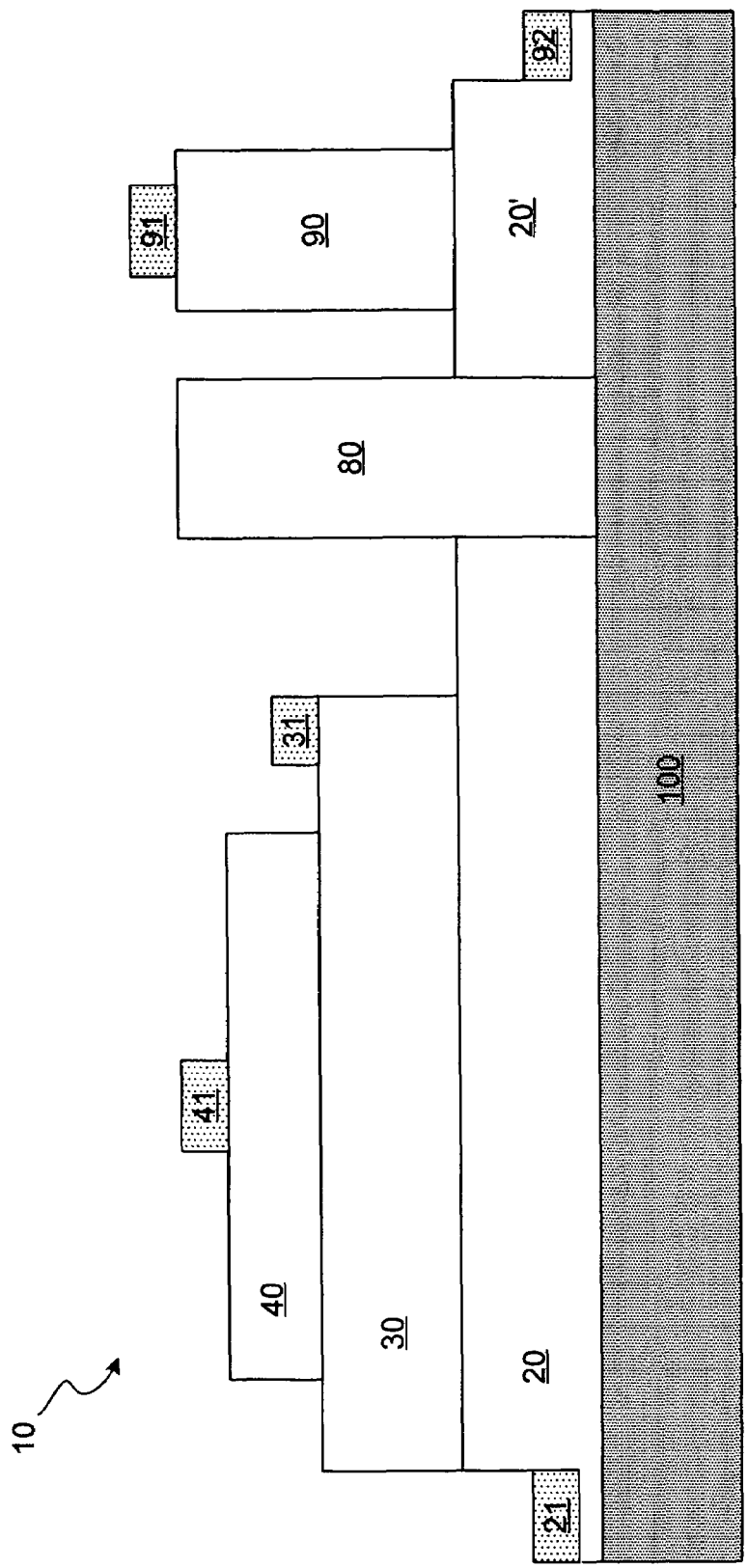
FIG. 5 is a structural block diagram of an integrated opto-electronic device employing a DHBT formed in accordance with the present disclosure.

The new InP-based DHBT disclosed herein facilitates integration of opto-electronic components, since the quaternary collector can also serve as a waveguide. This enables the monolithic integration of optics and electronics for the fabrication of detectors, modulators and other opto-electronic devices. As shown conceptually in FIG. 5, an opto-electronic device 80 such as an amplifier, photodetector, modulator, or light emitter such as a laser or LED, may be formed on the substrate 100 and optically coupled with the collector 20 of the DHBT 10, and thus be formed as an integral component of the same device as the DHBT. The opto-electronic device 80 could, in one embodiment, be butt coupled with the collector 20 (as depicted in FIG. 5), which offers simple fabrication and low insertion losses. As further shown in FIG. 5, the opto-electronic device 80 could be further coupled to the collector 20' of another DHBT, and could thus be adapted to pass light transmitted through the collector 20 on to the collector 20' of another DHBT after detecting, modulating, or amplifying it. As also shown in FIG. 5, in another embodiment an opto-electronic device 90 could be evanescently coupled with the electromagnetic field of the collector 20' of a DHBT, and controlled via electrodes 91 and 92.

Thus, the quaternary layer 20 of the present disclosure can serve as a waveguide for light having a wavelength of 1.5 microns, which enables the integration and fabrication of waveguides, detectors, modulators and other opto-electronic components with InP-based transistors. The presence of the quaternary waveguide material all across the substrate wafer 100 facilitates low insertion loss integration of optical components evanescently coupled with electromagnetic fields.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

What is claimed is:

1. A device, comprising:
   at least one bipolar transistor on a substrate and comprising a collector formed substantially of InGaAsP of a first conductivity type to transmit light therethrough, a base formed substantially of InGaAs or GaAsSb of a second conductivity type and in contact with the collector, an emitter of the first conductivity type in contact with the base, and transistor electrodes forming separate electrical contacts with each of the collector, base, and emitter, respectively; and
   at least one opto-electronic device optically coupled with the collector of the transistor to interact with the light transmitted therethrough.

2. The device of claim 1, wherein the opto-electronic device is adapted to emit, detect, modulate, or amplify light transmitted through the collector of the transistor.

3. The device of claim 1, wherein the opto-electronic device is butt coupled with the collector of the transistor.

4. The device of claim 1, wherein the opto-electronic device is evanescently coupled with the electromagnetic field of the collector of the transistor.

5. The device of claim 1, wherein the conduction band energy level of the base is higher than the conduction band energy level of $In_{0.53}Ga_{0.47}As$.

6. The device of claim 1, wherein the collector includes a sub-layer in contact with the substrate and having a higher doping concentration than the rest of the collector.

7. The device of claim 1, further comprising:
   a sub-collector layer formed substantially of InGaAs of the first conductivity type and in contact with the collector.

8. The device of claim 1, wherein the Ga mole fraction in the base is above 0.47.

9. The device of claim 1, comprising another transistor as claimed and wherein the opto-electronic device is further coupled to the collector of the other transistor.

10. The device of claim 1, comprising a plurality of bipolar transistors forming an integrated circuit.

11. The device of claim 4, further comprising:
    a first electrode forming an electrical contact with the opto-electronic device; and
    a second electrode forming an electrical contact with the opto-electronic device to control operation of the opto-electronic device.

* * * * *